(12) United States Patent
Chien et al.

(10) Patent No.: US 6,406,971 B1
(45) Date of Patent: Jun. 18, 2002

(54) FABRICATION METHOD FOR AN EMBEDDED DYNAMIC RANDOM ACCESS MEMORY (DRAM)

(75) Inventors: Sun-Chieh Chien; Chien-Li Kuo, both of Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/799,909

(22) Filed: Mar. 6, 2001

(30) Foreign Application Priority Data

Dec. 18, 2000 (TW) .......................... 089127057

(51) Int. Cl.⁷ .............................................. H01L 21/20
(52) U.S. Cl. ...................................................... 438/398
(58) Field of Search .................................. 438/398, 241, 438/210, 397

(56) References Cited

U.S. PATENT DOCUMENTS

| | | | | |
|---|---|---|---|---|
| 6,096,595 A | * | 1/2000 | Huang | 438/238 |
| 6,350,646 B1 | * | 1/2000 | Chen et al. | 438/253 |
| 6,080,620 A | * | 6/2000 | Jeng | 438/253 |

* cited by examiner

Primary Examiner—David Nelms
Assistant Examiner—Thao Phuong Le
(74) Attorney, Agent, or Firm—Thomas, Kayden, Horstemeyer & Risley

(57) ABSTRACT

The invention describes an embedded dynamic random access memory (DRAM) fabrication method. After several landing pads in the memory cell region of a substrate have been formed, a bit-line contact opening and first contact opening are formed simultaneously. The bit-line contact opening exposes the landing pad and the first contact opening exposes the NMOS of the periphery circuit region. An N-type ion implantation is performed to implant N-type ions into the landing pad the NMOS. After a bit-line contact, a first contact, and a bit-line have been formed, a storage node contact opening and a second contact opening are formed simultaneously. The storage node contact opening exposes another landing pad and the second contact opening exposes a P-type MOS in the periphery circuit region. A P-type ion implantation step is conducted to implant P-type ions into the landing pad and the PMOS exposed by the second contact opening. A storage node contact is formed in the storage node contact opening and a second contact is formed in the second contact opening. A capacitor is formed that is electrically connected to the storage node contact.

16 Claims, 12 Drawing Sheets

US 6,406,971 B1

FABRICATION METHOD FOR AN EMBEDDED DYNAMIC RANDOM ACCESS MEMORY (DRAM)

CROSS-REFERENCE TO RELATED APPLICATION

This application claims the priority benefit of Taiwan application Ser. No. 89127057, filed Dec. 18, 2000.

BACKGROUND OF THE INVENTION

1. Field of the Invention

The present invention relates to a fabrication method for a memory device. More particularly, the present invention relates to a fabrication method for an embedded direct random access memory (DRAM).

2. Description of the Related Art

Embedded dynamic random access memory (DRAM) are integrated devices that integrate a memory cell array and logic circuit array on a single wafer. Embedded DRAM can store large amounts of information at very high speeds and are of great benefit to the use of the integrated circuit. Often Embedded DRAM is applied to a logic circuit that processes large amounts of data, such as a graphic processor. A complete embedded DRAM comprises a logic circuit, a transfer field effect transistor (FET), and a capacitor coupled to a transfer field effect transistor. The transfer FET controls the connection between the capacitor's bottom electrode and the bit line. Thus, information can either be read from the capacitor or stored in the capacitor.

FIGS. 1A–1F are schematic drawings illustrating the conventional method of fabricating an embedded DRAM. As shown in FIG. 1A, a substrate is provided. A (metal oxide semiconductor) MOS transistor 110 is then formed above the P-type MOS region 106 and N-type MOS region 108 of the memory cell region 102 and the periphery circuit region 104 of the substrate 100. Afterwards, a barrier layer 111 is formed over the substrate 100 in order to cover a predetermined area where a self-aligned silicide is not formed. After conducting a self-aligned silicide fabrication process, a dielectric layer 112 is formed over the substrate 100. A landing pad 114 is then formed in the dielectric layer 112 of the memory cell region 102 of the substrate 100 (as shown in FIG. 1B).

Referring to FIG. 1C, a dielectric layer 116 is formed over the substrate 100, while a photoresist layer 123 is formed on the dielectric layer 116. With the photoresist serving as a mask, an etching step is performed to form a contact opening 118 in the dielectric layer 116 from the memory cell region 102. Simultaneously, contact openings 120, 122 are formed in the dielectric layers 112, 116 from the PMOS region 106 and NMOS region 108 of the peripheral circuit region 104, respectively.

Referring to FIGS. 1D and 1E, the photoresist 123 is removed. Conventionally, N-type ions and P-type ions would then be implanted into the NMOS region 106 and PMOS region 108 of the peripheral circuit region 104 before the contact openings 120, 122 are filled with a tungsten layer for forming contact windows, in order to reduce the current leakage from subsequently formed salicide region (source/drain region) on the substrate 100. However, the contact openings 120, 122 are formed simultaneously in the photolithographic and etching process for forming the bit line contact opening 118. So, when the MOS devices exposed in the contact openings 122, 120 are implanted with N-type ions and P-type ions respectively, extra photoresist would be required to cover contact openings 120, 118 or contact openings 122, 118 to make sure ions are implanted only into the contact opening 120 or 122. As shown in FIG. 1D, that means forming a photoresist 124 on the dielectric layer 116 for covering the contact openings 118, 120 before performing a N-type ion implantation on the MOS device exposed in the contact opening 122. As shown in FIG. 1E, the photoresist 124 is removed. After that, a photoresist 128 is formed on the dielectric layer 116 for covering the contact openings 118, 122 before a P-type ion implantation is performed on the MOS device exposed in the contact opening 120. Next, referring to FIG. 1F, the contact openings 118, 120, 122 are filled with a tungsten layer, so that a contact window 132 connecting to the memory cell region 102 is formed together with contact windows 134, 136 connecting respectively to the PMOS region 106 and NMOS region 108. Then, a bit line 138 is formed over the memory cell region 102 of the substrate 100, while forming a first metal layer 140, 142 over the peripheral circuit region 104, before any subsequent steps for fabricating the capacitor are performed.

In order to reduce the current leakage in the region where a self aligned silicide is not formed (i.e. the source/drain region), P-type and N-type ion implantation processes are typically conducted in the MOS device exposed by contact openings 120 and 122, before the contact openings are filled with a tungsten layer. However, contact openings 120 and 122 are formed by the same photoligthographic etching process in which the bit-line contact 118 is formed. Thus, an additional photoresist layer must be formed over the MOS exposed by the contact opening 122, during the implantation of N-type ions or over the MOS exposed by the contact opening 120 during the implantation of P-type ions. The photoresist layers 124 and 128 are formed to make sure that the ions are only implanted into the contact opening 122 or the contact opening 120. Accordingly, the conventional fabrication process requires the additional cost of two masks and increases, as a consequence, the number of fabrication steps, which also affects yield.

SUMMARY OF THE INVENTION

The invention provides a fabrication method for an embedded dynamic random access memory. In this method, after several landing pads are formed on the substrate, a dielectric layer is formed over the substrate. A bit-line contact opening that exposes the landing pad, and a contact opening that exposes the N-type MOS in the periphery circuit region is formed in the dielectric layer. An N-type ion implantation step is performed to implant N-type ions into the landing pad and N-type MOS. Afterwards, the first bit-line contact opening and the first contact opening are filled with a conductive layer to form a bit-line contact and first contact. A bit-line electrically connected to the bit-line contact is formed. Another dielectric layer is formed over the substrate. In the aforementioned dielectric layer, a storage node contact opening that exposes another landing pad and a second contact opening that exposes a P-type MOS in the periphery circuit region are formed. A P-type ion implantation is performed to implant P-type ions into the landing pad and the P-type MOS exposed by the second contact opening. The storage node contact opening and the second contact opening are filled with a conductive layer, to form a storage node contact and a second contact. A capacitor that is electrically connected to the storage node contact is then formed.

In the method of the present invention a bit-line contact opening is formed as the contact opening exposing the N-type MOS in the periphery circuit region is formed. However, a contact opening that exposes the P-type MOS in the periphery circuit region is not formed. Rather, a second contact opening that exposes the P-type MOS in the periphery circuit region is formed as the storage node contact is formed. Thus, following the formation of the bit-line contact and the storage node contact, an N-type and P-type ion implantation can be performed, to implant both N-type or P-type ions into the substrate without having to form an additional photoresist layer. As a result, the reduction of current leakage in the area where a self-aligned silicide is not formed can be attained through the implantation process.

Accordingly, through the present invention the number of photoresists used can be reduced. Moreover, the number of fabrication steps as well as fabrication cost can be reduced, resulting in an increased of the yield. Additionally, present invention provides an embedded dynamic random access memory (DRAM) that reduces current leakage in the area where a self-aligned silicide is not formed It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention, and, together with the description, serve to explain the principles of the invention. In the drawings.

DESCRIPTION OF THE PREFERRED EMBODIMENTS

Figure 1A:
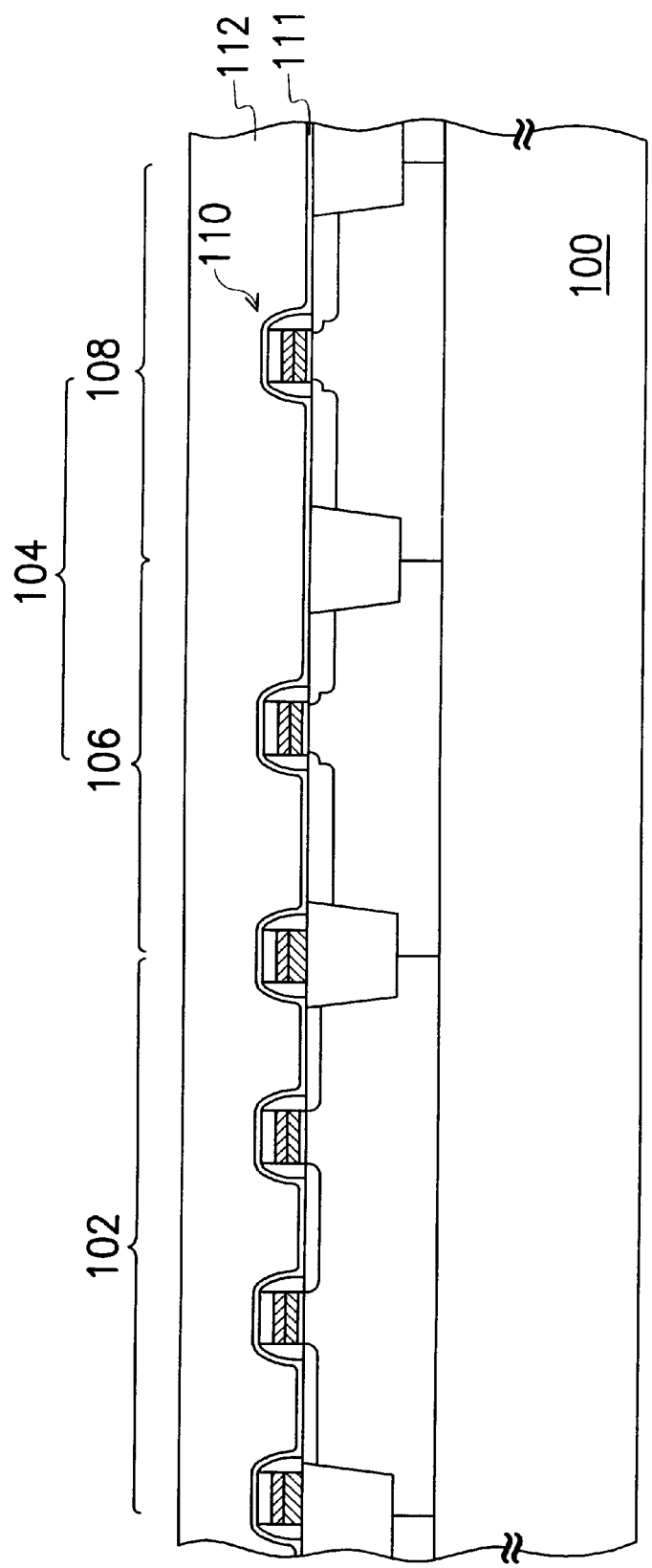
FIGS. 1A–1F are schematic drawings illustrating the process of fabricating a conventional embedded DRAM.
Figure 1B:
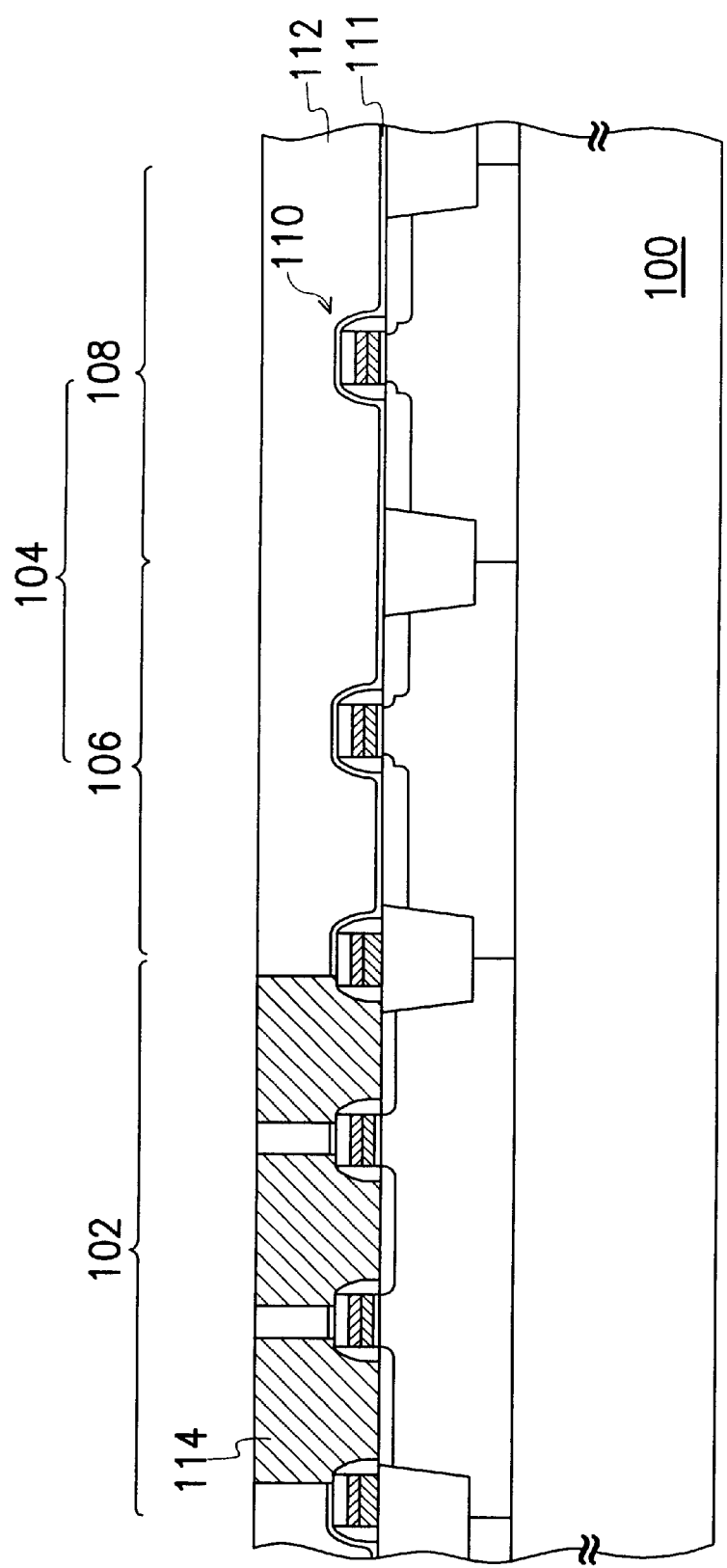
Figure 1C:
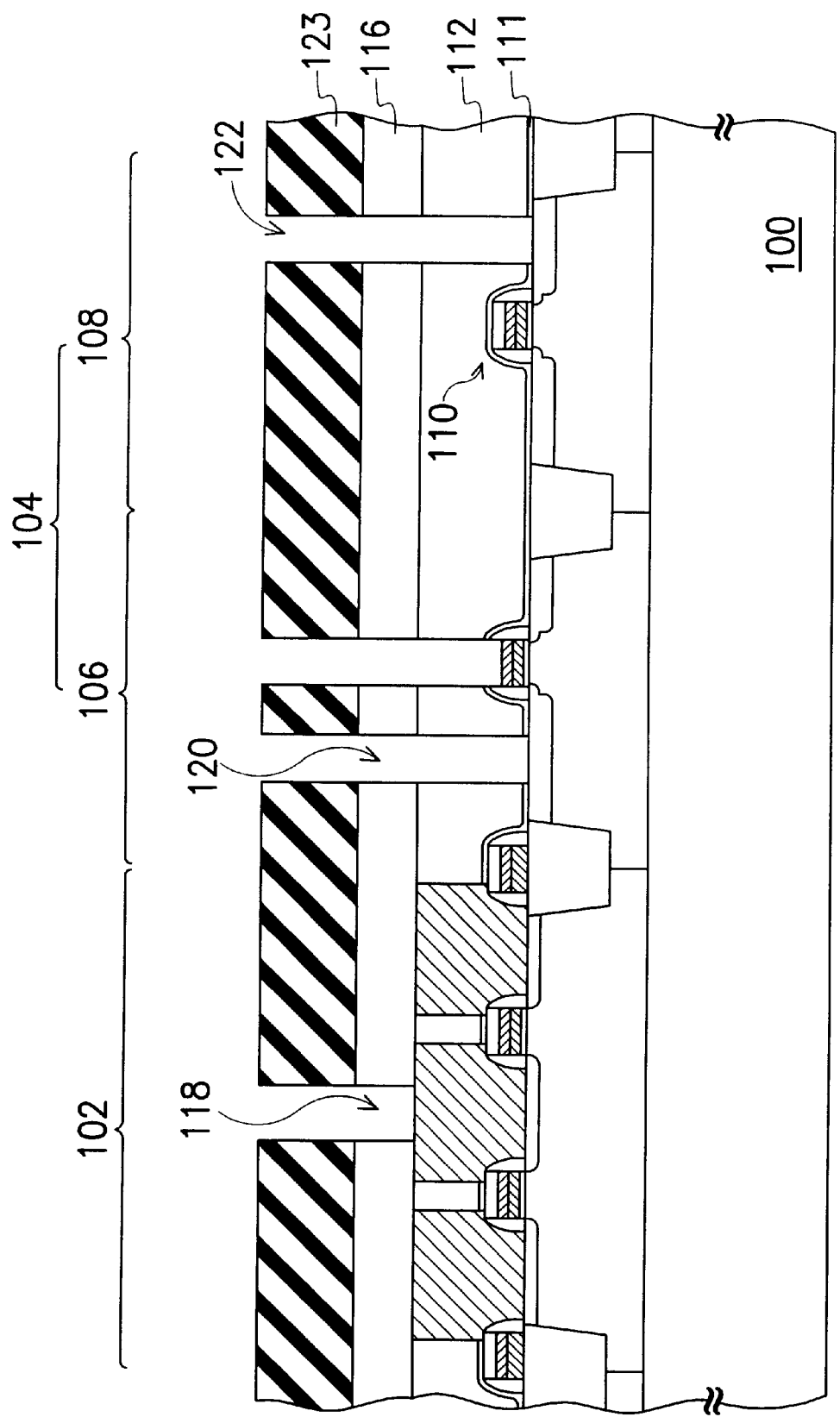
Figure 1D:
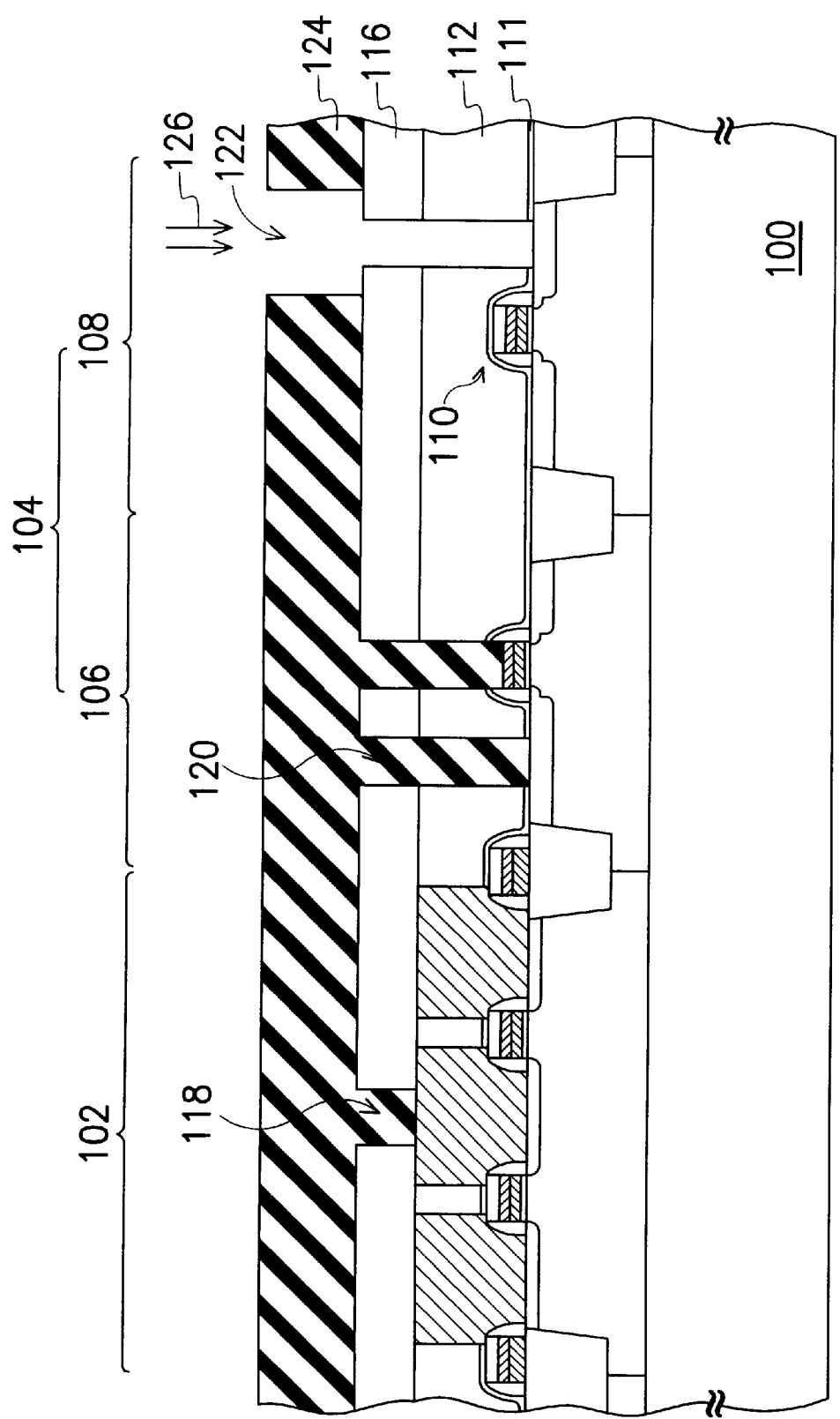
Figure 1E:
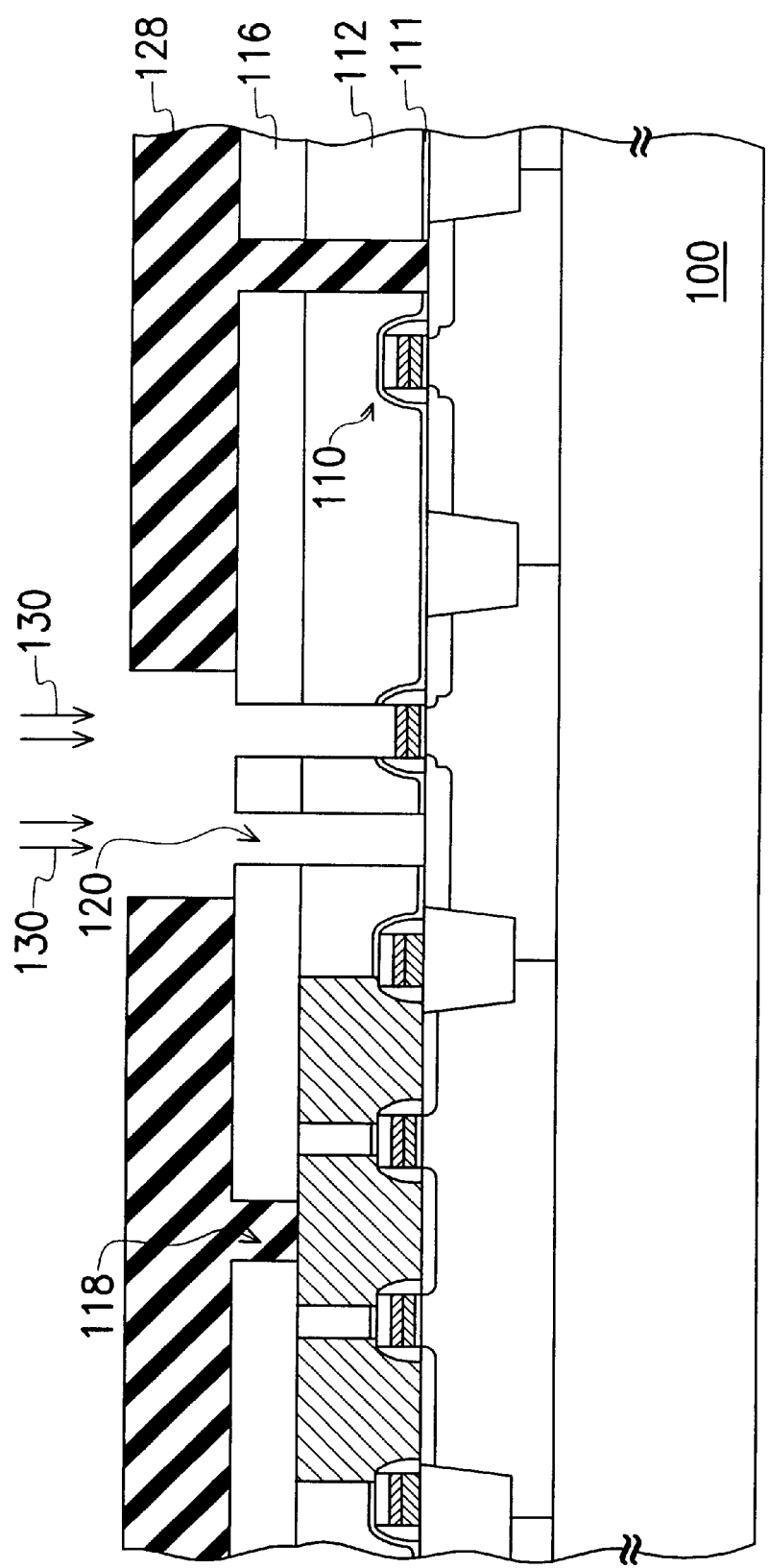
Figure 1F:
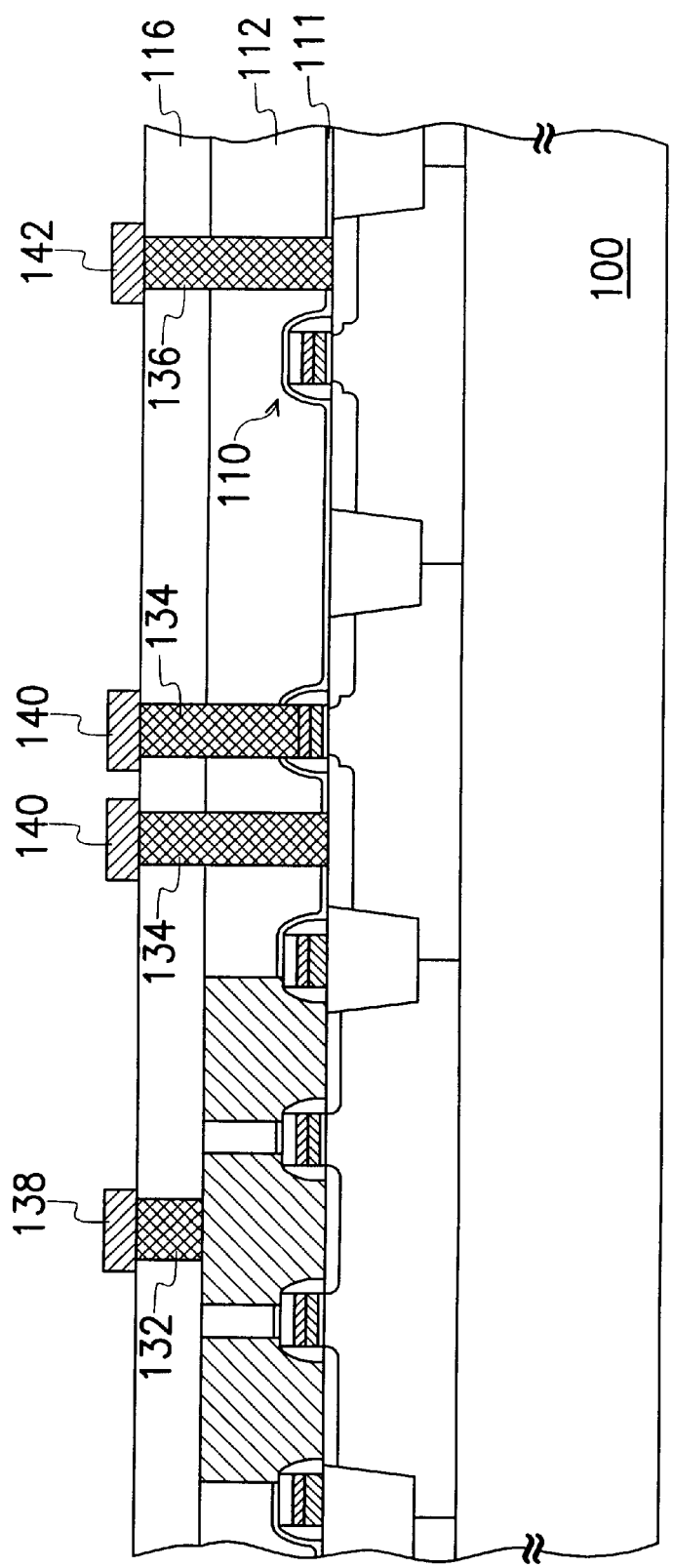
Figure 2A:
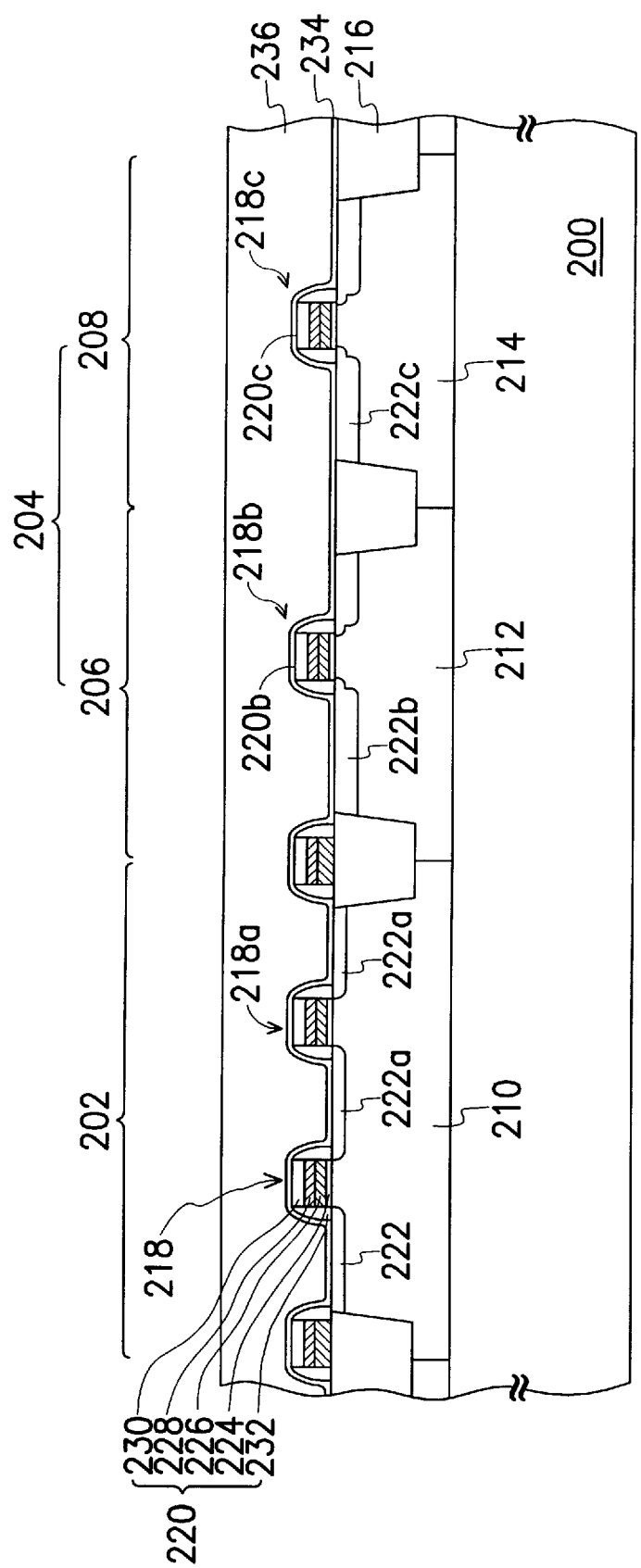
FIGS. 2A–2F are schematic drawings illustrating the process of fabricating an embedded DRAM according to a preferred embodiment of this invention.

As shown in FIG. 2A, a substrate 200 is provided. The substrate 200 is divided into a memory cell region 202 and a periphery circuit region 204, wherein the periphery circuit region 204 includes a PMOS region 206 and an NMOS region 208. On the substrate 200 a memory cell well 210, an N-type well 212 and a P-type well 214 are formed. The approximate doping concentration of the N-type well 212 and the P-type well 214 is about between $1\times10^{16}$ cm$^3$ and $1\times10^{17}$ cm$^3$. The doping concentration of the memory cell well 210 is lower than that of the N-type well 212 and P-type well 214. An isolation region 216 is then formed on the substrate 200. The isolation region 216 can be a trench formed in the substrate 200 by a shallow trench isolation layer (STI) method that has been refilled with an insulation layer.

As shown in FIG. 2A, a MOS transistor 218 is then formed in the memory cell region 202 and above the PMOS and NMOS regions of the periphery circuit region 204. MOS transistor 218 includes a gate 220 and a source/drain region 222. The gate 220 further includes a gate oxide layer 224, a polysilicon layer 226, a silicide layer 228, a cap layer 230 and a spacer 232. The method of forming the gate oxide layer 220 can include thermal oxidation. The method of forming the polysilicon layer 222 can include low-pressure chemical vapor deposition (LPCVD). The polysilicon layer 222 can be doped with ions to provide conductivity. The material of the silicide layer 228 can include tungsten silicide. The method for forming the silicide layer 228 can include physical vapor deposition (PVD) or chemical vapor deposition (CVD). The material of the cap layer 230 can include silicon nitride and the method for forming the cap layer 230 can include chemical vapor deposition (CVD). The material of the spacer 232 can include silicon nitride and the method for forming the spacer 232 can include the following procedure: A silicon nitride layer is formed over the substrate 200 by low pressure chemical vapor deposition (LPCVD). An etch back step is then conducted to form a spacer from the remaining portion of silicon nitride on a sidewall of the patterned gate oxide layer 224, the polysilicon layer 226, the silicide layer 228 and the cap layer 230. For the sake of clarity, the MOS transistor 218 formed in the PMOS region 206 of the memory cell 202 and the periphery circuit 204 as well as above the NMOS region 208 are labeled as 218a, 218b and 218c, respectively. Similarly, gate 220 is labeled as 220a, 220b and 220c, and source/drain region 220 is labeled as 222a, 222b and 222c respectively.

As shown in FIG. 2A, a barrier layer 234 is formed over the substrate 200 before conducting a self-aligned silicide fabrication process. The purpose of this step is to cover the area on the substrate 200 where the self-aligned silicide is not formed (i.e. the memory cell region 202 and periphery circuit region 204 of FIG. 2A). The material of the barrier layer 234 can include silicon nitride and the method of formation can include low-pressure chemical vapor deposition (LPCVD). A self-aligned silicide fabrication process is then conducted to form a self-aligned silicide above the area that has not been covered by the barrier layer (not shown). A dielectric layer 236 is then formed over the substrate 200. The material of the dielectric layer 236 can include silicon oxide and the method of formation can include a chemical vapor deposition (CVD).

Figure 2B:
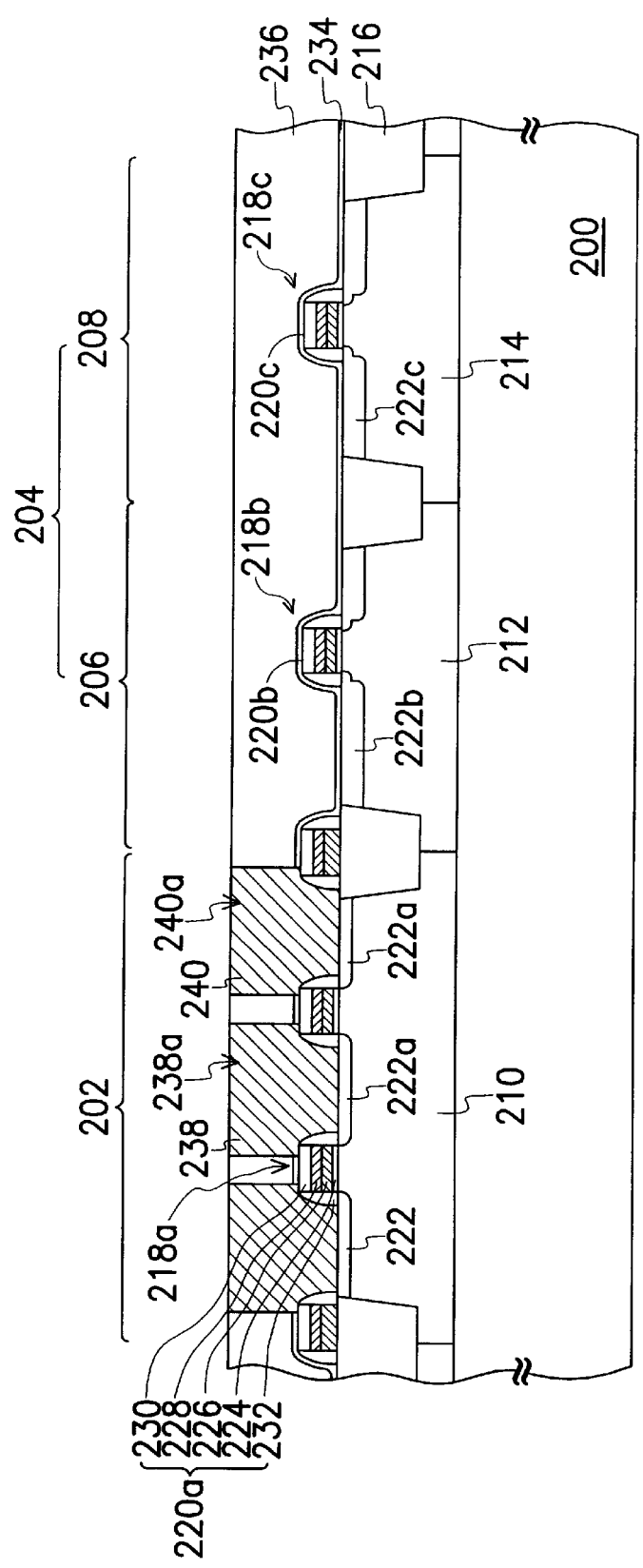

As shown in FIG. 2B, photoligthograpy and etching are performed to partially remove the dielectric layer 236 and the barrier layer of the memory cell region 202 to form self aligned contact openings 238 and 240 that expose the source/drain region 222a. The self-aligned contact openings 238a and 240a are then filled with a conductive layer, to form landing pads 238 and 240. The material of the conductive layer can include polysilicon that is doped to provide conductivity. The preferred method in forming the landing pads 238 and 240 includes low-pressure chemical vapor depositing polysilicon in the self-aligned contact openings 238a, 240a and above the dielectric layer 236, followed by peforming an etch back method or chemical mechanical polishing method to remove the polysilicon layer above the dielectric layer 236. The polysilicon layer can be doped in-situ, in order to provide conductivity. The approximate doping concentration is between $1\times1020$/cm$^3$ and $2\times1020$/cm$^3$.

Figure 2C:
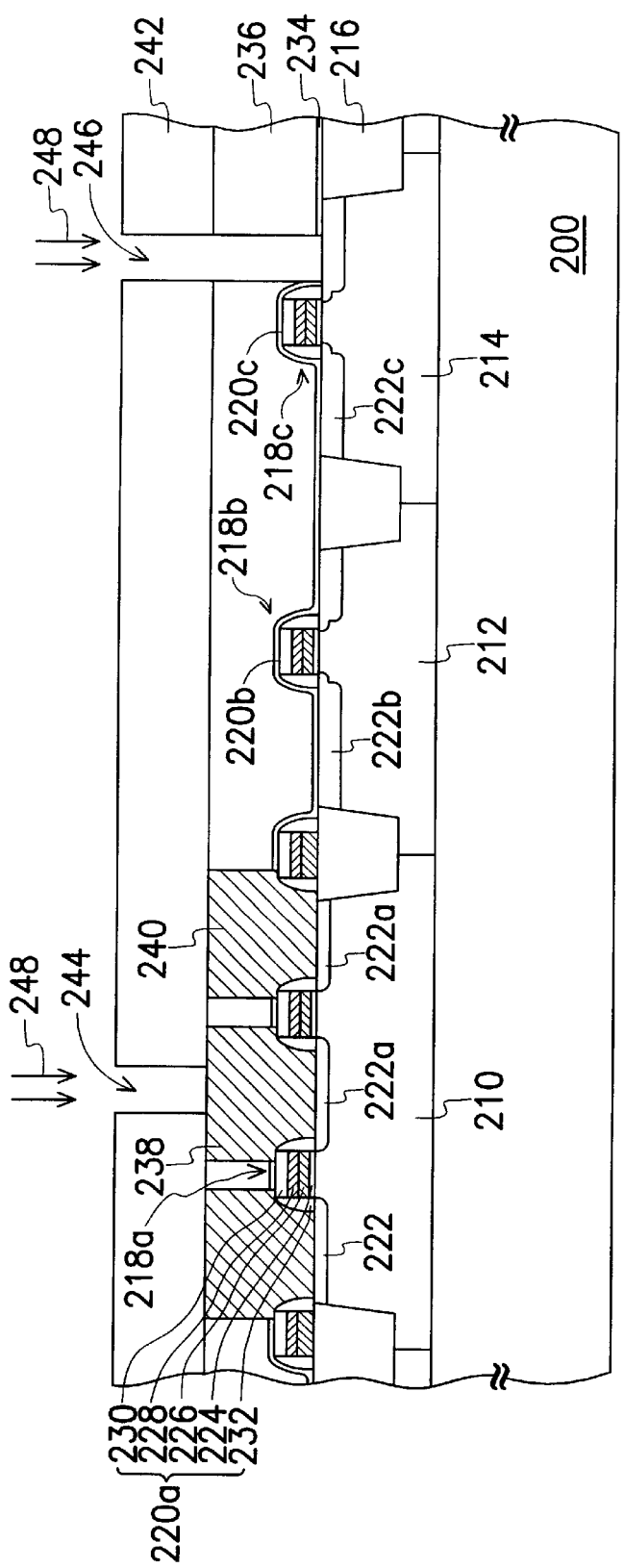

As shown in 2C, a dielectric layer 242 is then formed over the substrate 200. The material of the dielectric layer 242 can include silicon oxide. The method of formation can include chemical vapor deposition. Photolithography and etching are conducted to form a bit-line contact opening 244 in the dielectric layer 242 of memory cell region 202 that exposes the landing pad 238. Moreover, a contact opening 246 is formed in dielectric layers 242 and 236 and the barrier layer 234 above the NMOS region 208, that exposes the NMOS 218c. The contact opening 246 in FIG. 2C exposes the NMOS 218c formed above the NMOS region 208 and the source/drain region 222c, where self-aligned silicide is not formed. However, the region exposed by the contact opening 246 can include a gate or source/region where there is self-aligned silicide or where there is no self-aligned silicide. The region exposed by the contact opening 246 is not limited to what is depicted in FIG. 2C.

An ion implantation step 248 is conducted to implant N-type ions into the landing pad 238 and N-type MOS 218, to lower the current leakage of the region where self-aligned silicide is not formed (i.e. the source/drain region) above the NMOS region, without the need for an additional photomask. The dopant of the N-type ion implantation step 248 can include phosphorus or arsenic with a doping concentration between $3\times10^{14}/cm^3$ and $1\times10^{18}/cm^3$.

Figure 2D:
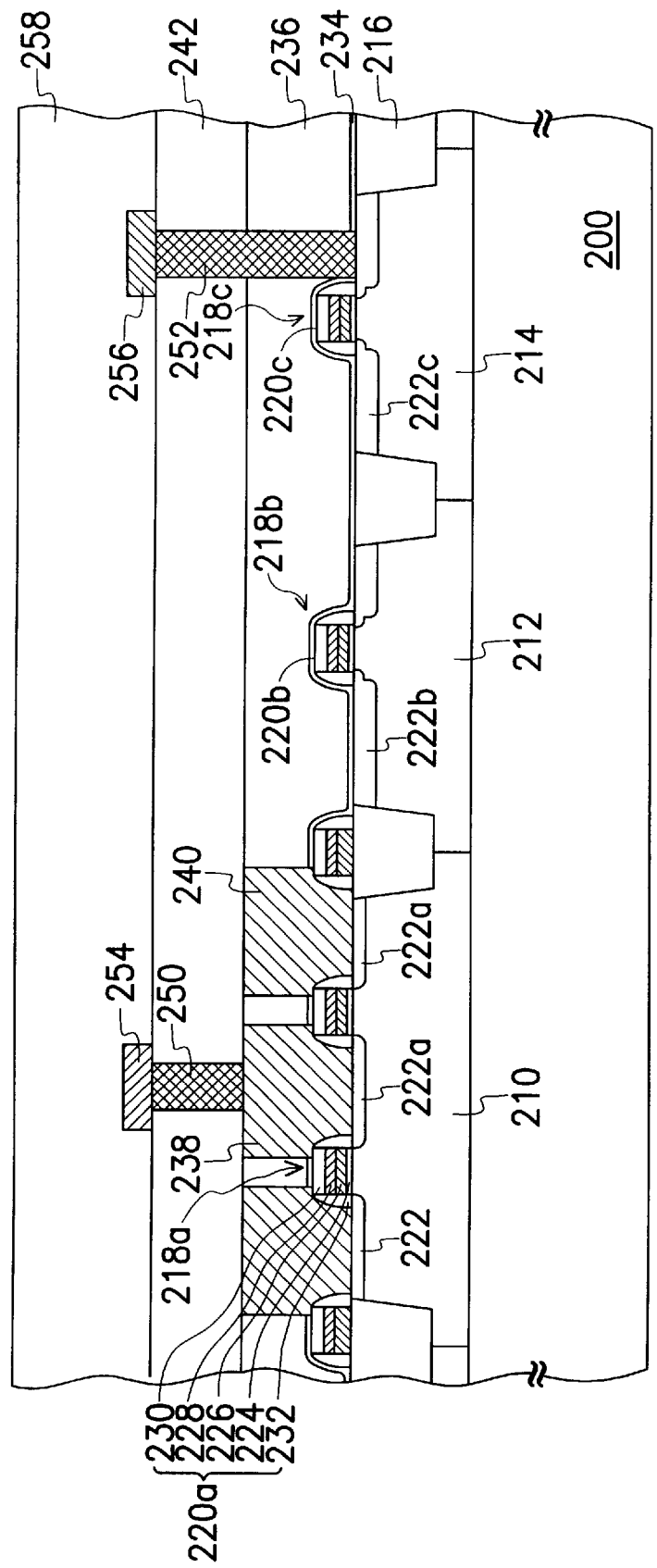

As shown in FIG. 2D, the bit-line contact opening 244 and the contact opening 246 are filled with a conductive layer, to form a bit-line contact 250 electrically connected to the landing pad 238 and to form a contact 252 electrically connected to the NMOS 218c of NMOS region 208.

The material of the conductive layer can include tungsten and the method of fabrication can include a chemical vapor deposition step to deposit a tungsten layer in both the bit-line contact opening 244 and the contact opening 246, as well as above the dielectric layer 242. Afterwards, an etch back step or chemical mechanical polishing step is performed to remove the tungsten metal layer above the dielectric layer 242. The tungsten-filled bit-line contact opening 242 and contact opening 246, form bit-line contact 250 and contact 252.

As shown in FIG. 2D, photolithography and etching are conducted to form above the dielectric layer 254 a bit-line 254 that is electrically connected to the bit-line contact 250 and to form a metal layer 256 that is electrically connected to the contact opening 252. Another dielectric layer 258 is then formed over the substrate 200. The dielectric layer 258 can be a multi-layered structure comprising alternating layers of silicon oxide and spin-on glass (SOG).

Figure 2E:
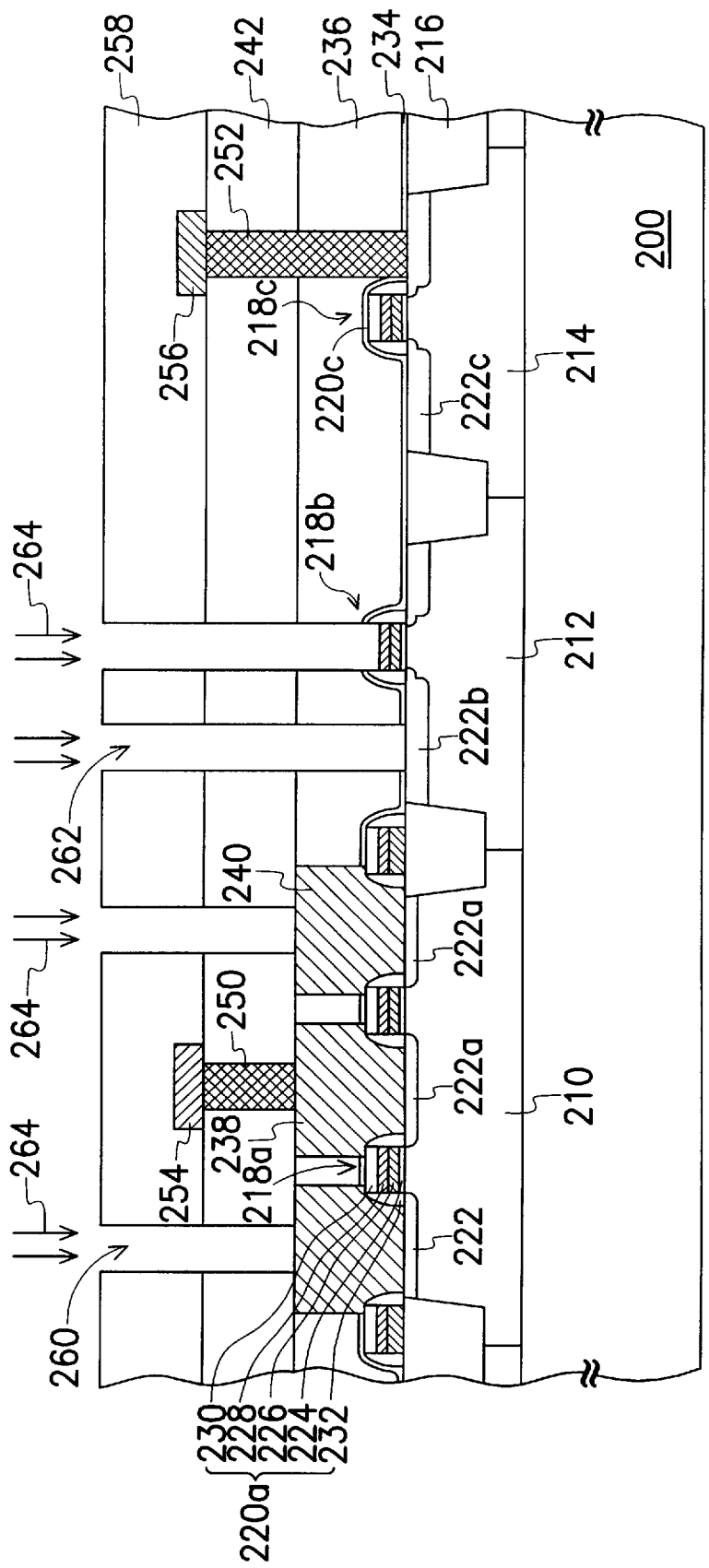

As shown in FIG. 2E, photolithography and etching are conducted to form a storage node contact opening 260 that exposes the landing pad 240, in the dielectric layer 258 and 254 of the memory cell 202. In addition, a contact opening 262 that exposes the PMOS 218b is formed in the dielectric layer 258, 254 and 236 as well the barrier layer 234 of the PMOS region 206. The contact opening 262, shown in FIG. 2E, exposes the source/drain region 222b of the P-type MOS 218b above the PMOS region 206, where self-aligned silicide has not been formed, and the silicide layer 228 of the gate 220b. However, the region exposed by the contact opening can actually include the gate or source/drain region where there is self-aligned silicide or where there is no self-aligned silicide. The region exposed by the contact opening 262, is not limited to what is depicted in FIG. 2E.

Without the need for an additional photomask, a P-type ion implantation step 264 is conducted to implant P-type ions into the PMOS transistor 218b exposed by the contact opening 262, to lower the current leakage of the unformed self-aligned silicide region (i.e. the source/drain region) above the PMOS region 206. The dopant of the P-type ion implantation step 264 can include boron with a concentration between $3\times10^4/cm^3$ and $1\times10^{18}/cm^3$. During the ion implantation step, P-type ions are also implanted into the landing pad 240 exposed by the storage node contact opening 260. However, the doping concentration of the P-type ions in the P-type implantation step 264 is approximately one percent the concentration of the N-type ions in the landing pad 240. Thus, the P-type ions of the P-type ion implantation step 264 only offset one percent of the N-type ions in the landing pad 240 and thus has very little impact on the resistivity of the landing pad 240.

Figure 2F:
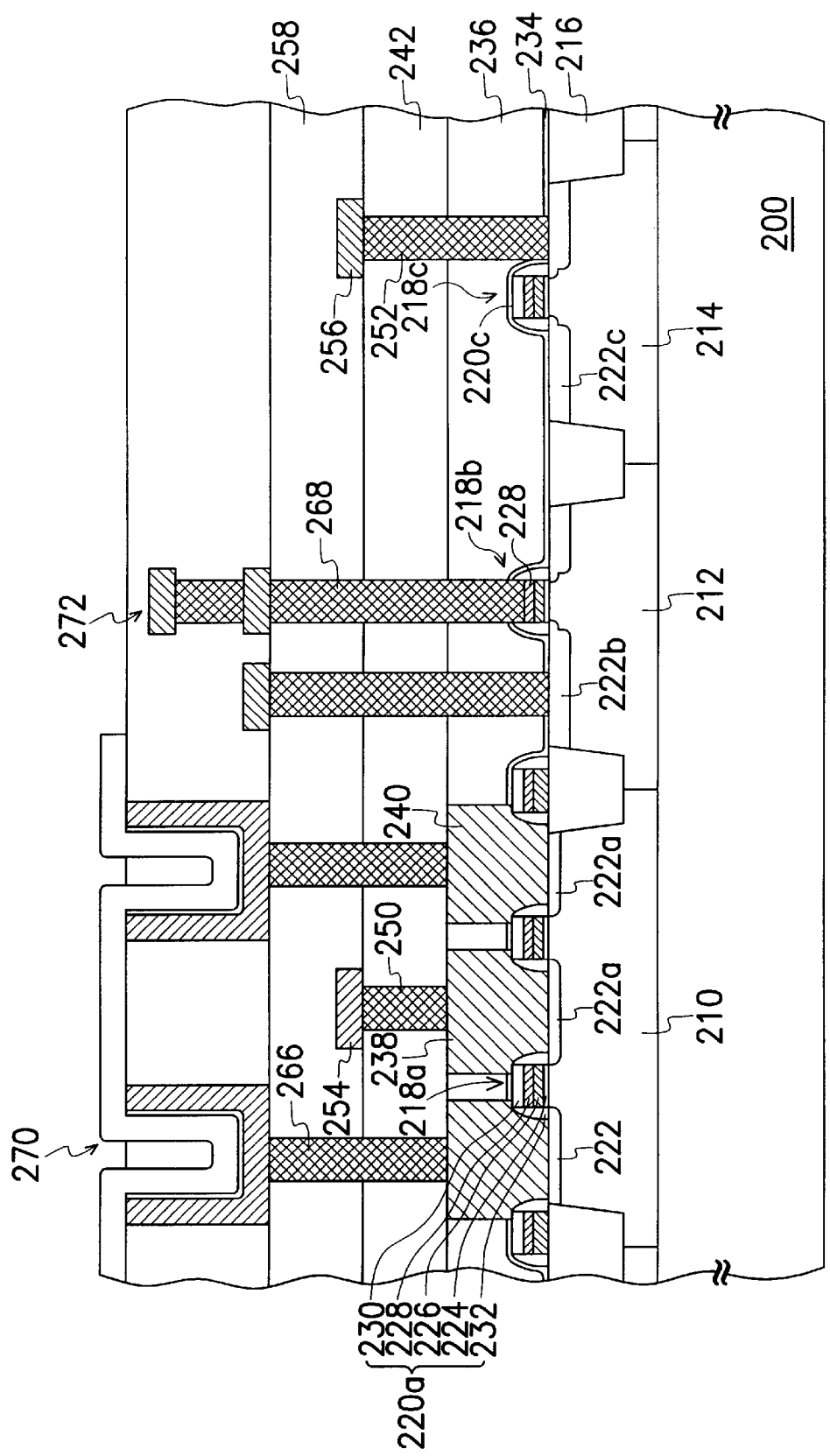

As shown in FIG. 2F, the storage node contact opening 260 and the contact opening 262 are filled with a conductive layer, to form a storage node contact 266 and contact 268. The material of the conductive layer can be tungsten, for example. The method of formation can include a chemical vapor deposition step to deposit a layer of tungsten metal in the storage node contact opening 260 and the contact opening 262, as well as above the dielectric layer 258. Afterwards, an etch back procedure or chemical mechanical polishing step is conducted to remove the tungsten metal above the dielectric layer 258, which results in storage node contact 266 and contact 268. After the storage node contact 266 has been formed, a capacitor 270 is formed to electrically connected to the source/drain region 222a through storage node contact 266 and landing pad 240, and the inner metal layer 272 is formed in the peripheral circuit region 204.

In the method of the present invention, the bit-line contact is formed at the same time as the contact opening that exposes the NMOS in the periphery circuit region. The contact opening that exposes the PMOS in the periphery circuit region, however, is not formed at this time. The second contact opening that exposes the PMOS in the periphery circuit region is instead formed as the storage node contact opening is formed. Thus, after the bit-line contact opening and the storage node contact opening have been formed, the N-type and P-type ion implantation steps can be performed directly after to implant N-type ions or P-type ions into the substrate. The ion implantation step, in the method of present invention, attains the goal of lowering the current leakage of the unformed self-aligned silicide region, without the necessity of having to form an additional photoresist.

Accordingly, the present invention can lower the current leakage of the unformed self-aligned silicide region. The method of the present invention can also reduce the number of masks used, which in turn lowers fabrication costs. Moreover, the method of the present invention can reduce the number of fabrication steps, which increases yield.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for an embedded direct random access memory (DRAM), comprising:

providing a substrate which has been divided into a memory cell region and a periphery circuit region, wherein the periphery circuit region further comprises a P type metal oxide semiconductor (PMOS) region and an NMOS region;

forming a plurality of MOS, each comprising a gate and a source/drain region, on the substrate of the memory cell region and periphery circuit region;

forming a barrier layer over the substrate to cover a designated region in which a self-aligned silicide is not formed, wherein the region comprises at least portions of the PMOS and NMOS regions in the memory cell and periphery circuit regions;

performing a self-aligned silicide fabrication step to form a metal silicide on the area outside the region in which the self-aligned silicide is not formed;

forming a first dielectric layer over the substrate that covers the memory cell region and the periphery circuit region;

forming at least a first landing pad and at least a second landing pad in the dielectric layer of the memory cell region, wherein the first and second landing pads are electrically connected to the source/drain region of the memory cell;

forming a second dielectric layer over the substrate that covers the first dielectric layer and the first and second landing pads;

forming a bit-line contact opening in the second dielectric layer of the memory cell region, and a first contact opening in the first and second dielectric layers of the NMOS region, wherein the bit-line contact opening exposes the first landing pad and the first contact opening exposes the NMOS;

performing an N-type ion implantation step to implant N-type ions into the first landing pad and the MOS in the NMOS region, exposed by the bit-line contact opening and the first contact opening;

forming a first bit-line contact and a first contact in the bit-line contact opening and the first contact opening;

forming a bit-line above the substrate, wherein the bit line is electrically connected to the bit-line contact;

forming a third dielectric layer above the substrate;

forming a storage node contact opening in the third and second dielectric layers of the memory cell region and forming a second contact opening in the third, the second and the first dielectric layers of the PMOS region, wherein the storage node contact opening exposes the landing pad and the second contact opening exposes the MOS of the PMOS region;

performing a P-type ion implantation step to implant P-type ions into the second landing pad and the MOS in the PMOS region, exposed by the storage node contact opening and the second contact opening;

forming a storage node contact and a second contact in the storage node contact opening and the second contact opening; and forming a capacitor above the substrate that is electrically connected to the node contact.

2. The fabrication method of claim 1, wherein the first and second landing pads comprises N-type doped polysilicon.

3. The fabrication method of claim 1, wherein the first and second landing pads are doped in situ.

4. The fabrication method of claim 1, wherein the concentration of the P-type ions in the P-type implantation step is lower than the concentration of N-type ions in the first and second landing pads.

5. The fabrication method of claim 4, wherein the concentration of the P-type ions in the P-type ion implantation step is about $3 \times 10^{14}/cm^3$ to about $1 \times 10^{18}/cm^3$.

6. The fabrication method of claim 4, wherein the doping concentration of the N-type ions in the first and second landing pads is about $1 \times 10^{20}/cm^3$ to about $2 \times 10^{20}/cm^3$.

7. A fabrication method for an embedded direct random access memory (DRAM), comprising:

providing a substrate which has been divided into a memory cell region and a periphery circuit region, wherein the periphery circuit region comprises a PMOS region and an NMOS region;

forming a plurality of MOS on the substrate of the memory cell region and periphery circuit region;

forming a first dielectric layer over the substrate that covers the memory cell and the periphery circuit region;

forming a first and a second landing pads in the memory circuit region;

forming a second dielectric layer over the substrate that covers the first dielectric layer and the first and second landing pads;

forming concurrently a bit-line contact and first contact and a first contact above the substrate, wherein the bit-line contact and the first landing pad are electrically connected and the first contact and the MOS of the NMOS region are electrically connected;

forming a bit-line above the substrate, wherein the bit line is electrically connected to the bit-line contact;

forming a third dielectric layer above the substrate;

forming a storage node contact and a second contact above the substrate, wherein the storage node contact and the second landing pad are electrically connected and the second contact and the MOS of the PMOS region are electrically connected; and forming a capacitor above the substrate, wherein the capacitor is electrically connected to the storage node contact.

8. The fabrication method of claim 7, wherein forming the first and second landing pads, further comprises:

forming a barrier layer above the substrate to cover a predefined region, where a self-aligned silicide is not formed, wherein the predefined region at least comprises a part of the PMOS and MOS regions of the memory cell and periphery circuit regions,; and performing a self-aligned silicide fabrication process to form a metal silicide above the substrate in a region outside of the predefined region where the self-aligned silicide is not formed.

9. The fabrication method of claim 7, wherein forming the first and second landing pad comprises:

performing a self-aligned silicide contact opening fabrication process to form a plurality of self-aligned suicide contact openings; and filling the self-aligned suicide contact openings with a conductive layer to form a first and second landing pads that are each electrically connected to source/drain regions of the memory cell region.

10. The fabrication method of claim 7, wherein the step of concurrently forming the bit-line and the first contact includes:

forming a bit line contact in the second dielectric layer of the memory cell region, and a first contact opening in the first dielectric layer and the second dielectric layer of the NMOS region, wherein the bit line contact exposes the first landing pad and the first contact opening exposes the MOS of the N-MOS region;

performing a first N-type ion implantation step to implant N-type ions into the first landing pad and the MOS of the NMOS region, exposed by the first bit-line contact opening and the first contact opening; and filling the bit-line contact opening and the first contact opening with a conductive layer, to form the bit-line contact and the first contact.

11. The fabrication method of claim 10, wherein the concurrent formation of the storage node contact and the second contact comprise:

forming the storage node contact opening in the second and third dielectric layers and forming a second contact opening in the third, second and first dielectric layers above the PMOS region, wherein the storage node contact opening exposes the second landing pad and the second contact opening exposes the MOS in the PMOS region;

performing a P-type ion implantation step to implant P-type ions into the second landing pad and the MOS of the PMOS region, exposed by the storage node contact opening and the second contact opening; and filling the storage node contact opening and the second contact opening with a conductive layer to form the storage node contact and the second contact.

12. The fabrication method of claim 11, wherein the first and second landing pads both comprise N-type doped polysilicon.

13. The fabrication method of claim 12, wherein the first and second landing pads are doped in-situ.

14. The fabrication method of claim 11, wherein a concentration of P-type ions in the P-type ion implantation step is lower than a concentration of N-type ions in the first and second landing pads.

15. The fabrication method of claim 14, wherein the concentration of P-type ions in the P-type ion implantation step is about $3\times10^{14}/cm^3$ to about $1\times10^{18}/cm^3$.

16. The fabrication method of claim 14, wherein the N-type doping concentration of the first and second landing pads is about $1\times10^{20}/cm^3$ to about $2\times10^{20}/cm^3$.

* * * * *